(12) United States Patent
Xia et al.

(10) Patent No.: US 11,582,840 B2
(45) Date of Patent: Feb. 14, 2023

(54) MICROWAVE SHIELDING PLATE AND MICROWAVE COOKING DEVICE

(71) Applicants: GUANGDONG MIDEA KITCHEN APPLIANCES MANUFACTURING CO., LTD., Foshan (CN); MIDEA GROUP CO., LTD., Foshan (CN)

(72) Inventors: Ran Xia, Foshan (CN); Taofei Huang, Foshan (CN); Ning Sun, Foshan (CN)

( * ) Notice: Subject to any disclaimer, the term of this patent is extended or adjusted under 35 U.S.C. 154(b) by 569 days.

(21) Appl. No.: 16/620,523

(22) PCT Filed: Dec. 29, 2017

(86) PCT No.: PCT/CN2017/120081
§ 371 (c)(1),
(2) Date: Dec. 8, 2019

(87) PCT Pub. No.: WO2018/223675
PCT Pub. Date: Dec. 13, 2018

(65) Prior Publication Data
US 2021/0153309 A1    May 20, 2021

(30) Foreign Application Priority Data

Jun. 8, 2017   (CN) .......................... 201710429028.0

(51) Int. Cl.
*H05B 6/64* (2006.01)
*H05B 6/76* (2006.01)
*H05K 9/00* (2006.01)

(52) U.S. Cl.
CPC ........... *H05B 6/6414* (2013.01); *H05B 6/763* (2013.01); *H05K 9/0056* (2013.01)

(58) Field of Classification Search
CPC ........ F24C 15/02; F24C 15/36; H05B 6/6414; H05B 6/763; H05B 6/766; H05B 6/76; H05K 9/0056
USPC ........ 219/739, 729, 734, 736, 738, 740, 741, 219/756
See application file for complete search history.

(56) References Cited

U.S. PATENT DOCUMENTS

| 7,256,753 B2 * | 8/2007 | Werner .............. H01Q 15/0086 343/756 |
| 2014/0196942 A1 | 7/2014 | Suwa et al. |
| 2022/0039220 A1 * | 2/2022 | Kolheb ................. H05B 6/766 |

FOREIGN PATENT DOCUMENTS

| CN | 1521454 A | 8/2004 |
| CN | 1523293 A | 8/2004 |
| CN | 1534240 A | 10/2004 |

(Continued)

OTHER PUBLICATIONS

Translation of CN204987134U, "Microwave heating equipment's door body and microwave heating equipment", Jan. 20, 2016, by ProQuest. (Year: 2016).*

(Continued)

*Primary Examiner* — Quang T Van
(74) *Attorney, Agent, or Firm* — Kilpatrick Townsend & Stockton, LLP

(57) ABSTRACT

A microwave shielding plate and a cooking device are disclosed. The microwave shielding plate includes one or more conductive layers, a conductor is provided in each of the conductive layers, and two ends of the conductor are provided with wiring points, so that a shielding section covering the conductive layers is formed when the conductor is coupled into a conductive loop.

11 Claims, 3 Drawing Sheets

(56) References Cited

FOREIGN PATENT DOCUMENTS

| | | |
|---|---|---|
| CN | 102484911 A | 5/2012 |
| CN | 103175242 A | 6/2013 |
| CN | 203442932 A | 2/2014 |
| CN | 105042654 A | 11/2015 |
| CN | 204987134 U | 1/2016 |
| CN | 106103555 A | 11/2016 |
| CN | 107218638 A | 9/2017 |
| DE | 3644276 A1 | 7/1988 |
| DE | 4233471 A1 | 4/1994 |
| EP | 2469976 A1 | 6/2012 |
| JP | 2004253386 A | 9/2004 |

OTHER PUBLICATIONS

Translation of CN102484911A, "Electromagnetic wave heating device", Aug. 4, 2015, by ProQuest. (Year: 2015).*
OA for EP application 17912445.8.
OA for JP application 2019-568077.

\* cited by examiner

MICROWAVE SHIELDING PLATE AND MICROWAVE COOKING DEVICE

CROSS-REFERENCE TO RELATED APPLICATIONS

This application is a national stage of International Application No. PCT/CN2017/120081, filed on Dec. 29, 2017, which claims a priority to and benefits of Chinese Patent Application No. 201710429028.0, filed on Jun. 8, 2017, the entire contents of which are incorporated herein by reference.

FIELD

The present disclosure relates to a field of microwave shielding technology, and more particularly, to a microwave shielding plate and a microwave cooking device.

BACKGROUND

Taking a microwave oven as an example, a metal mesh is used for microwave shielding in a conventional microwave oven door. When the metal mesh serves as a microwave shielding layer, the damage of the microwave shielding layer is relatively intuitive. With the application of visualized microwave oven doors, microwave shielding layers meeting the visualization requirement have emerged, and damages of these visible microwave shielding layers are not easily observed by the naked eye, and causing microwave leakage after microwave shielding layers of microwave cooking devices are damaged.

SUMMARY

The present disclosure aims to at least solve one of the technical problems in the related art.

One objective of the present disclosure is to propose a microwave shielding plate and a microwave cooking device, to solve the problem of failing to find out damage of a microwave shielding structure in the related art.

In order to achieve the objective, the present disclosure provides a microwave shielding plate. The microwave shielding plate includes one or more conductive layer, and each of the conductive layers is provided with a conductor therein. Both ends of the conductor are provided with wiring points, and a shielding section covering the conductive layer is formed when the conductor is coupled into a conductive loop.

In one embodiment, the conductor is continuously bent in a plane to form a spiral shape or a zigzag shape.

In one embodiment, the conductor adopts a visible material, the microwave shielding plate further includes a transparent mounting substrate, and the conductor is fixed on a side surface of the transparent mounting substrate.

In one embodiment, the conductor is a transparent metal conductive sheet.

In one embodiment, conductive layers are provided, and orthographic projections of all the conductors on the mounting substrate form a solid area.

In one embodiment, one conductive layer is provided, and the conductor includes main conductive segments parallel to each other and a transitional conductive segment for connecting adjacent main conductive segments, the adjacent main conductive segments being disposed in close proximity.

In one embodiment, one conductive layer is provided, and the conductor includes conductive coils, adjacent conductive coils being disposed in close proximity.

In one embodiment, the microwave shielding plate further includes an electrical performance detector coupled with the conductor.

The present disclosure further proposes a microwave cooking device, including an oven door and an oven body, in which at least one of the oven door and the oven body is provided with the microwave shielding plate.

In one embodiment, when the oven door is provided with the microwave shielding plate, the oven door includes a conductive door frame, the microwave shielding plate is fixed in the conductive door frame, and wiring points and the conductive door frame are electrically connected, and a conductive loop is formed between the conductive door frame and the conductor.

In one embodiment, the microwave cooking device further includes a judging device configured to receive detection data of the electrical performance detector and sends an alarm signal when the change amplitude of the detection data exceeds a set value.

The technical solutions of the present disclosure have the following advantages. The microwave shielding plate of the present disclosure includes one or more conductive layers, each of the conductive layers is internally provided with a conductor, and both ends of the conductor are provided with wiring points. Thus, when the microwave shielding plate is mounted into the corresponding microwave cooking device, the conductor is coupled into the conductive loop and forms a shielding section covering the conductive layer. Once the microwave shielding plate is damaged, the electrical performance of the conductive loop changes, that is, the microwave leakage can be detected in time by detecting the change of the electrical performance, and objectively reflecting whether the shielding material of the oven door fails or not, accurately monitoring the microwave leakage, and timely controlling the switch of the microwave cooking device, to reduce the dangers of the microwave leakage.

BRIEF DESCRIPTION OF THE DRAWINGS

In order to illustrate technical solutions in embodiments of the present disclosure, drawings used in description of the embodiments will be briefly introduced below.

Figure 1:
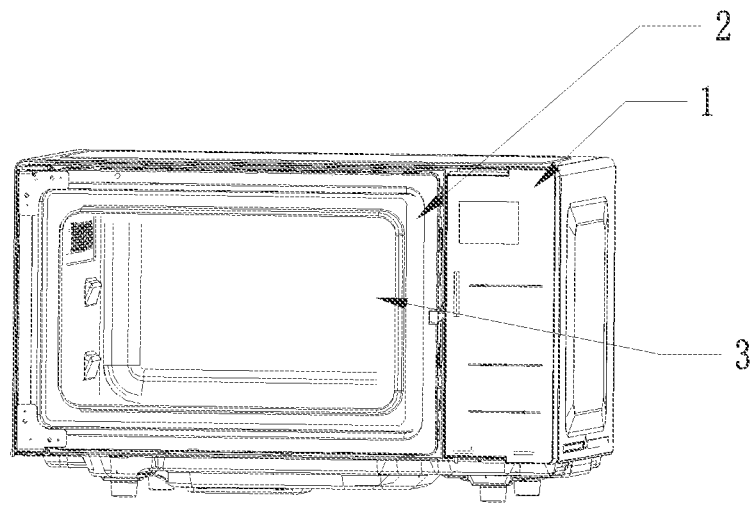
FIG. 1 illustrates a structural schematic view of a microwave cooking device according to an embodiment of the present disclosure.

REFERENCE NUMERALS 1 oven body, 2 oven door, 3 visual observation window, 4 door frame, 12 microwave shielding plate, 13 protection cover plate, 16 main conductive segment, 17 transitional conductive segment, 18 first conductive layer, 19 second conductive layer.

DETAILED DESCRIPTION

In order to understand the objectives, features and advantages of the present disclosure more clearly, the present disclosure will be described in detail with reference to the drawings and specific embodiments. It should be noted that the embodiments in the present disclosure and the features in the embodiments may be combined in the case of no conflict.

In the specification, it is to be understood that terms such as "central," "longitudinal," "transverse," "upper," "lower," "front," "rear," "left," "right," "vertical," "horizontal," "top," "bottom," "inner," and "outer" should be construed to refer to the orientation as then described or as shown in the drawings under discussion. These relative terms are for convenience and simplicity of description, and do not indicate or imply that the device or element referred to must have a particular orientation, or be constructed and operated in a particular orientation. Thus, these terms should not be constructed to limit the present disclosure. In addition, the features defined with "first," "second," and "third" are used herein for purposes of description and are not intended to indicate or imply relative importance or significance.

In the present disclosure, it should be noted that unless specified or limited otherwise, the terms "connected," and "coupled" are used broadly, and may be, for example, fixed connections, detachable connections, or integral connections; may also be mechanical or electrical connections; may also be direct connections or indirect connections via intervening structures.

FIRST EMBODIMENT

Without loss of generality, this first embodiment of the present disclosure is described by way of an oven door 2 of a microwave cooking device being provided with a microwave shielding plate 12. It should be understood that the microwave shielding plate 12 of this first embodiment can also be applied to any other product requiring microwave shielding and can be installed anywhere in the product. Moreover, the microwave shielding plate 12 of the first embodiment can also be an independent product.

Referring to FIG. 1, the microwave cooking device of the first embodiment includes an oven body 1 and an oven door 2.

Figure 2:
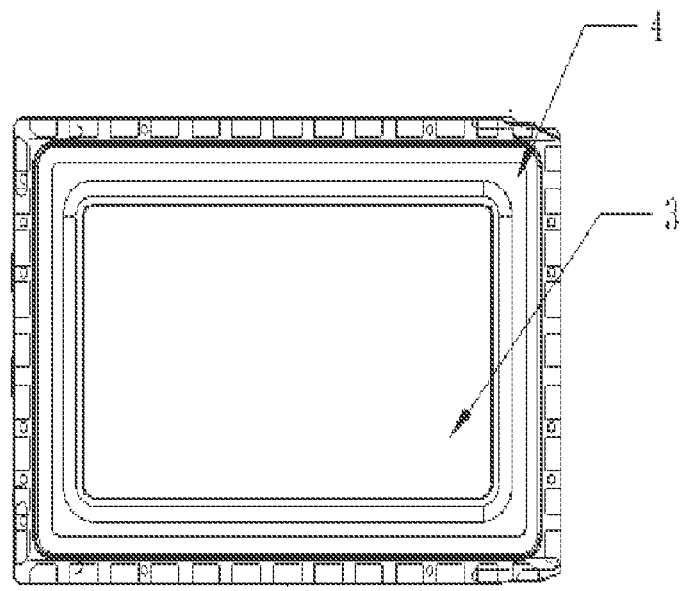
FIG. 2 illustrates a front view of an oven door of a microwave cooking device according to an embodiment of the present disclosure.
Figure 3:
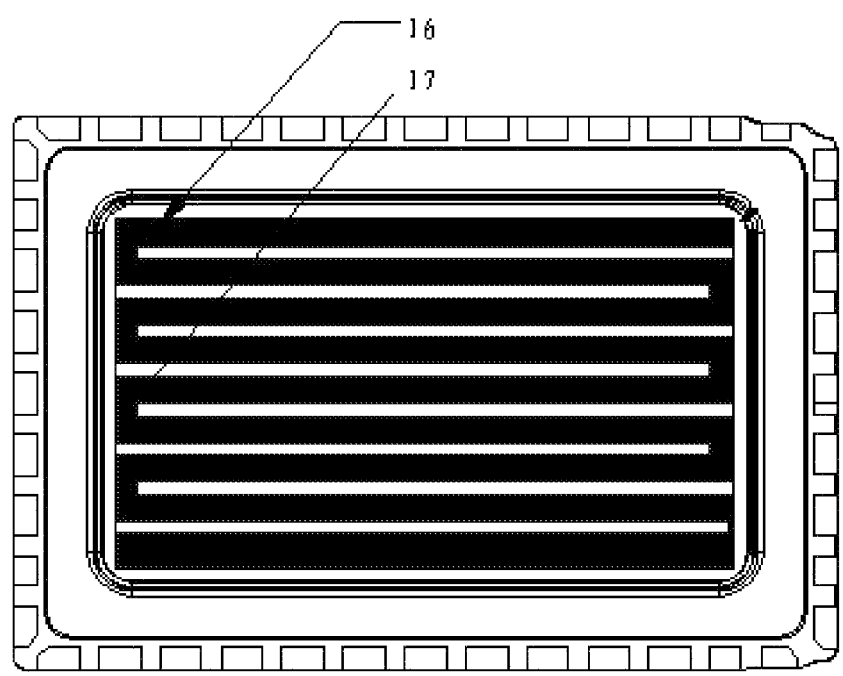
FIG. 3 illustrates a partial side sectional view of an oven door of a microwave cooking device according to an embodiment of the present disclosure.

The structure of the oven door 2 can refer to FIGS. 2 and 3. It can be seen from FIG. 3 that the oven door 2 includes the microwave shielding plate 12.

Moreover, it can be known from FIG. 3 that a protection cover plate 13 is also provided at an outer side (i.e., a side away from the oven body 1) of the oven door 2 and configured to protect the microwave shielding plate 12 and other structures disposed on the oven door 2.

On this basis, the first embodiment provides a microwave shielding plate 12.

The microwave shielding plate 12 of the first embodiment includes one or more conductive layers, each of the conductive layers is individually provided with a conductor, and both ends of the conductor are provided with wiring points, so that a shielding section covering the conductive layer is formed when the conductor is coupled into a conductive loop.

Once the microwave shielding plate 12 of the first embodiment is damaged, the electrical performance of the conductive loop changes, that is, the microwave leakage can be detected in time by detecting the change of the electrical performance, and objectively reflecting whether the microwave shielding plate 12 loses efficacy or not and accurately monitoring the microwave leakage.

It is worth mentioning that the microwave shielding plate 12 of the first embodiment can judge whether its microwave shielding function is valid or not based on the change of its own electrical performance parameters, without need to additionally provide a microwave leakage detecting device.

When the microwave shielding plate 12 is applied to a microwave cooking device, by monitoring whether the microwave shielding plate 12 is invalid, it is possible to control a switch of the microwave cooking device in time, which greatly reduces dangers caused by the microwave leakage.

The number of conductors in the conductive layers is not limited. In one embodiment, a single conductor is provided in each conductive layer and the conductors in the conductive layers are continuous, so that there are only two wiring points on the entire conductive layers, which ensures the simple structure of the conductive layers. When there are conductors in each conductive layer, both ends of each conductor need to be provided with the wiring points, so that the respective conductors are coupled to different conductive loops, and the risk of microwave leakage is detected in an area corresponding to the current conductor based on the change of the electrical performance parameters in each of the conductive loops.

The number of the conductive layers is not limited, and may be, for example, one layer or any number of layers can be provided.

Further, "the conductive layer" can be understood to include a gap area between conductors. Thus, in the above description that "a shielding section covering the conductive layer is formed when the conductor is coupled into a conductive loop," the term "covering the conductive layer" requires covering the conductors, and the gap area between the conductors if there is any gap between the conductors. That is, the term "covering the conductive layer" is substantially equivalent to "covering the microwave shielding plate 12."

Figure 4:
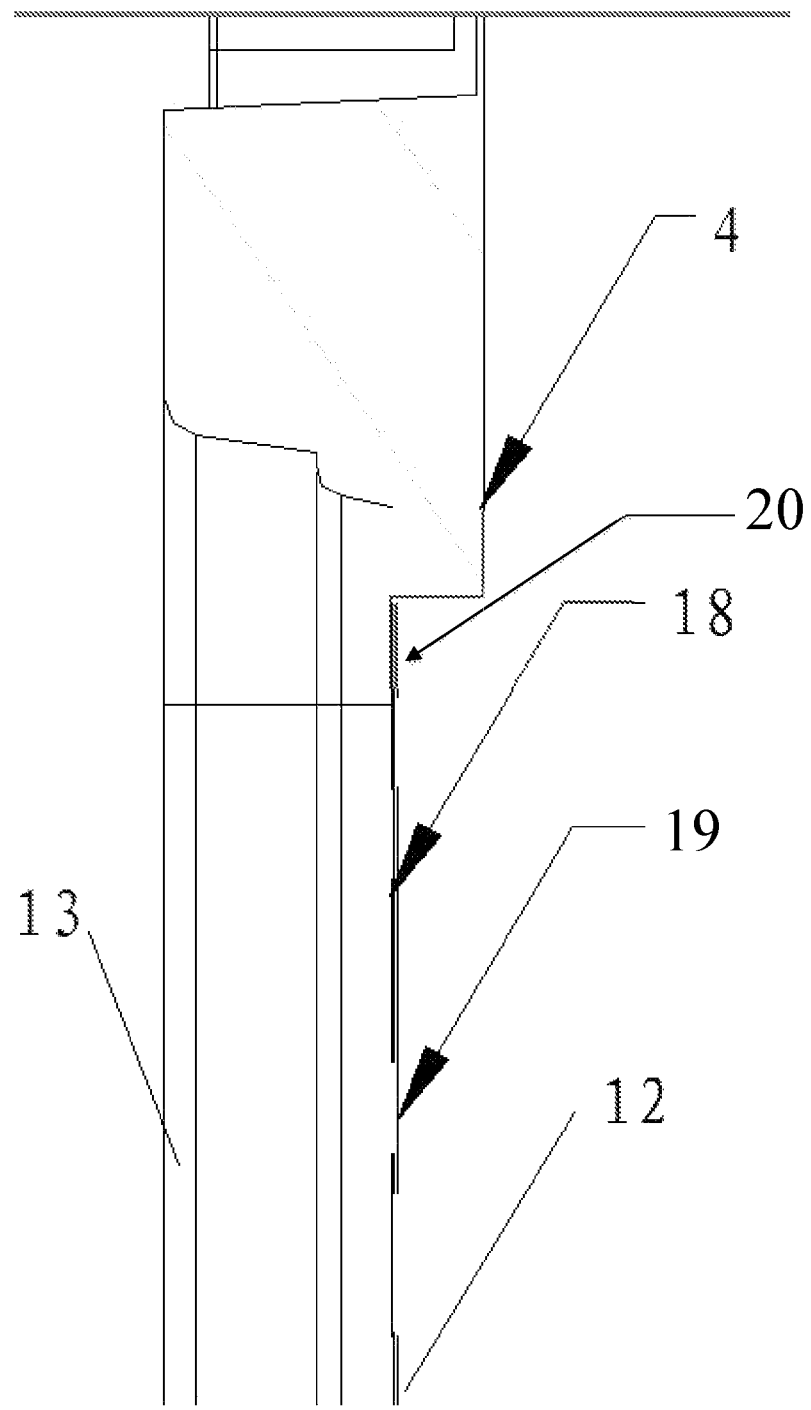
FIG. 4 illustrates a structural schematic view of a conductor according to an embodiment of the present disclosure.

Referring to FIG. 4, the conductor in the conductive layer of the first embodiment is continuously bent in a plane to form a zigzag shape. In this case, the conductor includes main conductive segments 16 parallel to each other and a transitional conductive segment 17 for connecting adjacent ones of the main conductive segments 16. In FIG. 4, the main conductive segment 16 is in the horizontal direction, and the transitional conductive segment 17 connects the adjacent main conductive segments. In one embodiment, the individual main conductive segments 16 are not necessarily arranged in parallel, as long as the distribution of the conductor ensures the formation of the shielding section covering the conductive layer when the conductor is coupled to the conductive loop.

The conductor of the first embodiment is In one embodiment made of a visible material to obtain a visible microwave shielding plate 12. For example, the conductor may be a transparent metal conductive sheet.

Moreover, in order to fix the conductor made of the above visible material and ensure a visual effect of the microwave shielding plate 12, in one embodiment the microwave shielding plate 12 further includes a transparent mounting substrate, and the conductor is fixed on a side surface of the transparent mounting substrate.

As shown in FIG. 3, the microwave shielding plate 12 of the first embodiment has two conductive layers, which are assumed to be a first conductive layer 18 and a second conductive layer 19.

A first conductor is provided in the first conductive layer 18, and a second conductor is provided in the second conductive layer 19. The first conductor and the second conductor are disposed to cross each other and fixed to the transparent mounting substrate, and the first conductor can just block the gap of the second conductor, and orthographic projections of all the conductors on the mounting substrate form a solid area. At this time, the microwave has no path that can directly pass through the microwave shielding plate 12. In one embodiment, but not necessarily, the first conductor and the second conductor are identical in structure, facilitating production and maintenance.

It should be noted that the number of conductive layers and the distribution of conductors in the conductive layers are not limited. The number of conductive layers and the distribution of conductors depend on the shielding effectiveness of the microwave shielding plate 12.

For example, one conductive layer can be provided. At this time, it is necessary to ensure that a gap between the adjacent main conductive segments 16 of the conductor is not more than 1/20 of an operating wavelength of the microwave cooking device, to guarantee the shielding effectiveness of the microwave shielding plate 12. In one embodiment, when the adjacent main conductive segments 16 are disposed in close proximity, the shielding effectiveness is optimal, and it can be basically ensured that there is no path capable of directly passing through the conductive layer.

In one embodiment, three or more conductive layers may be provided, as long as the distribution of conductors in various conductive layers can also ensure the shielding effectiveness of the microwave shielding plate 12.

In the conductive layer in accordance with one embodiment, the thickness of the conductor is 10 times or more of the skin depth of the conductor material under the operating wavelength.

Based on the above, the microwave shielding plate 12 of the first embodiment further includes an electrical performance detector connected to the conductor. Thus, when the microwave shielding plate 12 is coupled into the conductive loop, the electrical performance detector can determine whether the microwave shielding plate 12 is damaged by detecting changes in electrical performance parameters in the conductive loop.

In one embodiment, the microwave shielding plate 12 itself may not be provided with the above electrical performance detector, in which case an external electrical performance detector is used to determine whether the microwave shielding plate 12 is damaged by detecting changes in electrical performance parameters in the conductive loop.

In order to protect the electrical performance detector, an impedance is In one embodiment coupled into the conductive loop. The impedance can be coupled to the conductor and thus belongs to the microwave shielding plate 12; the impedance can also be mounted to other parts of the conductive loop other than the above conductor.

When the above microwave shielding plate 12 is mounted to the oven door 2, a conductive loop is formed between the oven door 2 and the conductor of the conductive layer. When the conductor is intact and working normally, the conductive loop is in a good electrical conduction state, and a measured value of resistance of the entire conductive loop should be low. When the conductor is damaged, the resistance suddenly increases. When the resistance value and the change rate of the resistance value reach specified values, it is determined that the microwave leakage occurs in the oven door 2.

When there is microwave leakage in the oven door 2, the user can be informed of the failure of the conductor and at the same time the microwave cooking device can be controlled to be powered off.

On the above basis, for the microwave cooking device of the first embodiment, further referring to FIG. 2, when the oven door 2 is provided with the microwave shielding plate 12, the oven door 2 includes a conductive door frame 4, the microwave shielding plate 12 is fixed in the conductive door frame 4, and the wiring points and the conductive door frame 4 are electrically connected, and a conductive loop is formed between the conductive door frame 4 and the conductor. In order to obtain the above conductive door frame 4, in one embodiment, that the door frame 4 is made of a metal material.

It should be noted that the microwave shielding plate 12 does not necessarily need to form the conductive loop with the door frame 4 of the oven door 2, and a detection circuit may be additionally provided in the microwave cooking device, and forming a conductive loop between the detection circuit and the conductor.

The microwave cooking device of the first embodiment further includes a judging device that receives detection data of the electrical performance detector and sends an alarm signal when the change amplitude of the detection data exceeds a set value.

In one embodiment, the microwave cooking device may further include a processing device configured to process the detection data of the electrical performance detector and transmit the processed data to the judging device.

Further, it is found from FIGS. 1 and 2 that when the above microwave shielding plate 12 is visible, a visual observation window 3 is formed on the oven door 2.

SECOND EMBODIMENT

The difference from the first embodiment is that the conductor of the second embodiment is continuously bent in a plane to form a spiral shape.

When one conductive layer is provided, and the conductor includes conductive coils, it is ensured that a gap between the adjacent conductive coils of the conductor is not more than 1/20 of an operating wavelength of the microwave cooking device, to guarantee the shielding effectiveness of the microwave shielding plate 12.

In one embodiment, when the adjacent conductive coils are disposed in close proximity, the shielding effectiveness is optimal, and it can be basically ensured that there is no path capable of directly passing through the conductive layer.

What is claimed is:

1. A microwave shielding plate, comprising:
one or more conductive layers, each of the one or more conductive layers provided with a conductor therein, the first and second ends of the conductor provided with wiring points, and a shielding section covering the one or more conductive layers being formed when the conductor is coupled into a conductive loop;
wherein microwave leakage is detected according to change of electrical performance parameters in the conductive loop.

2. The microwave shielding plate according to claim 1, wherein the conductor is continuously bent in a plane to form a spiral shape or a zigzag shape.

3. The microwave shielding plate according to claim 2, further comprising:
a transparent mounting substrate; and
the conductor is fixed on a side surface of the transparent mounting substrate, wherein the conductor adopts a visible material.

4. The microwave shielding plate according to claim 3, wherein the conductor is a transparent metal conductive sheet.

5. The microwave shielding plate according to claim 3, wherein orthographic projections of the one or more conductors on a mounting substrate form a solid area.

6. The microwave shielding plate according to claim 3, wherein the conductor comprises a plurality of main conductive segments parallel to each other and a transitional conductive segment for connecting adjacent main conductive segments, the adjacent main conductive segments being disposed in close proximity.

7. The microwave shielding plate according to claim 3, wherein the conductor comprises a plurality of conductive coils, adjacent conductive coils being disposed in close proximity.

8. The microwave shielding plate according to claim 1, further comprising an electrical performance detector coupled with the conductor and configured to detect the change of the electrical performance parameters in the conductive loop.

9. A microwave cooking device, comprising:
an oven door and an oven body, wherein at least one of the oven door and the oven body is provided with a microwave shielding plate, comprising:
one or more conductive layers, each of the one or more conductive layers provided with a conductor therein, the first and second ends of the conductor provided with wiring points, and a shielding section covering the one or more conductive layers being formed when the conductor is coupled into a conductive loop;
wherein microwave leakage is detected according to change of electrical performance parameters in the conductive loop.

10. The microwave cooking device according to claim 9, wherein when the oven door is provided with the microwave shielding plate, the oven door comprises a conductive door frame, the microwave shielding plate is fixed in the conductive door frame, and wiring points and the conductive door frame are electrically connected, wherein a conductive loop is formed between the conductive door frame and the conductor.

11. The microwave cooking device according to claim 10, further comprising a judging device configured to receive detection data of an electrical performance detector and sends an alarm signal when a change amplitude of the detection data exceeds a set value.

\* \* \* \* \*